(12) United States Patent
Shuvalov (10) Patent No.: US 11,777,476 B2
(45) Date of Patent: Oct. 3, 2023

(54) LEVEL SHIFTER CIRCUIT WITH INTEGRATED FEEDBACK CIRCUIT, DC-DC CONVERTER, AND METHOD

(71) Applicant: NXP USA, Inc., Austin, TX (US)

(72) Inventor: Denis Sergeevich Shuvalov, Munich (DE)

(73) Assignee: NXP USA, Inc., Austin, TX (US)

( * ) Notice: Subject to any disclaimer, the term of this patent is extended or adjusted under 35 U.S.C. 154(b) by 175 days.

(21) Appl. No.: 17/469,236

(22) Filed: Sep. 8, 2021

(65) Prior Publication Data
US 2022/0103162 A1 Mar. 31, 2022

(30) Foreign Application Priority Data
Sep. 30, 2020 (EP) .................... 20199329

(51) Int. Cl.
*H03K 3/037* (2006.01)
*H02M 3/158* (2006.01)

(52) U.S. Cl.
CPC .......... *H03K 3/0375* (2013.01); *H02M 3/158* (2013.01)

(58) Field of Classification Search
CPC .... H03K 5/003; H03K 5/1565; H03K 5/1252; H03K 5/02; H03K 5/131–135; H03K 5/1515; H03K 5/08; H03K 5/086; H03K 5/153; H03K 5/24; H03K 5/2472; H03K 5/1508; H03K 19/0944; H03K 19/017509; H03K 19/00315; H03K 19/01855; H03K 19/017; H03K 19/0016; H03K 19/01759; H03K 19/0963; H03K 19/01728;

(Continued)

(56) References Cited

U.S. PATENT DOCUMENTS 6,809,553 B2  10/2004  Morini et al.
7,432,745 B2  10/2008  Hwang et al.
(Continued)

FOREIGN PATENT DOCUMENTS

EP  3174203 B1  12/2019

OTHER PUBLICATIONS

Li et al., "A High Speed and Power-Efficient Level Shifter for High Voltage Buck Converter Drivers," 2010 10th IEEE International Conference on Solid-State and Integrated Circuit Technology, 3 pages.

(Continued)

*Primary Examiner* — Bryan R Perez (57) ABSTRACT

There is described a pulse-triggered level shifter circuit comprising: i) a command circuit configured to shift a command input signal of a first voltage domain to a command output signal of a second voltage domain, the command circuit comprising: a) a command input stage for receiving the command input signal, and b) a command output stage for providing the command output signal; and ii) a feedback circuit coupled to the command circuit and configured to shift a feedback input signal of a third voltage domain to a feedback output signal of a forth voltage domain, the feedback circuit comprising: c) a feedback input stage for receiving the command output signal as the feedback input signal, and d) a feedback output stage for providing the feedback output signal. The command circuit and the feedback circuit are hereby integrated into one single level shifter circuit.

17 Claims, 7 Drawing Sheets

(58) Field of Classification Search
CPC ........... H03K 19/0005; H03K 19/0813; H03K 19/21; H03K 19/215; H03K 19/0027; H03K 19/0021; H03K 19/1737; H03K 19/0185; H03K 3/037; H03K 3/012; H03K 3/356017; H03K 3/35104; H03K 3/356165; H03K 3/35613; H03K 3/017; H03K 3/0315; H03K 3/2885; H03K 3/356; H03K 3/3562; H03K 3/3565; H03K 3/02335; H03K 3/0322; H03K 3/0372; H03K 3/0375
See application file for complete search history.

(56) References Cited

U.S. PATENT DOCUMENTS

| | | | |
|---|---|---|---|
| 8,044,699 | B1 | 10/2011 | Kelly |
| 10,103,734 | B2 | 10/2018 | Bianchi et al. |
| 10,270,448 | B1 | 4/2019 | Blutman et al. |
| 10,432,199 | B1* | 10/2019 | Zhang ................... H03K 3/037 |
| 2001/0045859 | A1 | 11/2001 | Tsuji et al. |
| 2007/0164789 | A1 | 7/2007 | Panjwani et al. |
| 2012/0049829 | A1* | 3/2012 | Murakami ............. H02M 1/32 327/333 |
| 2019/0028097 | A1 | 1/2019 | Song et al. |

OTHER PUBLICATIONS

Larsen et al., "High-voltage pulse-triggered SR latch level-shifter design considerations," 2014 NORCHIP Conference Paper, 6 pages.

Liu et al., "Design of 370-ps Delay Floating-Voltage Level Shifters With 30-V/ns Power Supply Slew Tolerance," IEEE Transactions on Circuits and Systems II: Express Briefs, vol. 63, issue 7, Jul. 2016, 5 pages.

Liu et al., "A New Design Technique for Sub-Nanosecond Delay and 200 V/ns Power Supply Slew-Tolerant Floating Voltage Level Shifters for GaN SMPS," IEEE Transactions on Circuits and Systems, vol. 66, issue 3, Mar. 2019, 11 pages.

Jiang et al., "A Miniaturized Low-Intensity Ultrasound Device for Wearable Medical Therapeutic Applications," IEEE 5 Transactions on Biomedical Circuits and Systems, vol. 13, issue 6, 2019, 11 pages.

* cited by examiner

Prior art
Fig. 7 ns LEVEL SHIFTER CIRCUIT WITH
INTEGRATED FEEDBACK CIRCUIT, DC-DC
CONVERTER, AND METHOD

TECHNICAL FIELD

The present disclosure relates to a pulse-triggered level shifter circuit for shifting an input signal of a first voltage domain to an output signal of a second voltage domain. In particular, the disclosure relates to a level shifter circuit that comprises a level shifter of command logic signal and a level shifter of feedback logic signal integrated in one single level shifter circuit. The disclosure further relates to a DC-DC converter which comprises said level shifter circuit. Furthermore, the disclosure relates to a method of operating the pulse-triggered level shifter circuit.

The disclosure may hence relate to the technical field of (pulse-triggered) level shifter circuits and DC-DC converters.

TECHNICAL BACKGROUND

Level shifter circuits are circuits that shift (translate) signals from one voltage domain to another voltage domain. In general, these voltage domains, as well as expected signal voltage swings, correspond to different supplies, not necessarily having any common reference potential. In context of present document, a level shifter circuit may shift logic signals between a low voltage supply domain of control logic and a supply domain of an actuator in presence of high voltage difference between their reference potentials.

Level shifter circuits are often applied in DC-DC converters which convert a source of direct current from one voltage domain to another, e.g. in a power management applications. In particular high-frequency synchronous DC-DC converters, dealing with high-voltage conversions, require command and feedback signals which are exchanged with delays in the (sub) nano-second (nS) scale between the low voltage supply domain of logic and the high voltage domain of a high-side switch gate driver, which is referenced either to the highest potential in the converter or to the converter switching node, transiting between low and high voltage during converter operation.

A drawback of conventional level shift circuits may be speed reduction at an increased voltage difference between. This issue is solved by applying a pulse-triggered level shifter circuit, known in the art. A pulse-triggered level shifter requires an additional pulse generator circuit to generate short pulses of currents, which pass between the low voltage domain of logic and the high voltage domain of the actuator, thereby toggling the output signal of a level shifter with respect to input signal. Due to a reduced voltage swing (when switching) in nodes of a pulse-triggered level shifter, comparing to the conventional level shifter, issues regarding signal propagation delays at an increase of the voltage difference between the low voltage domain of logic and the high voltage domain of actuator may be solved. The duration of pulses set by the additional pulse generator circuits is hereby selected to guaranty (by design) a state change (in particular of a latch circuit of the level shifter) of the output signal of the level shifter with respect to the input signal.

Figure 7:
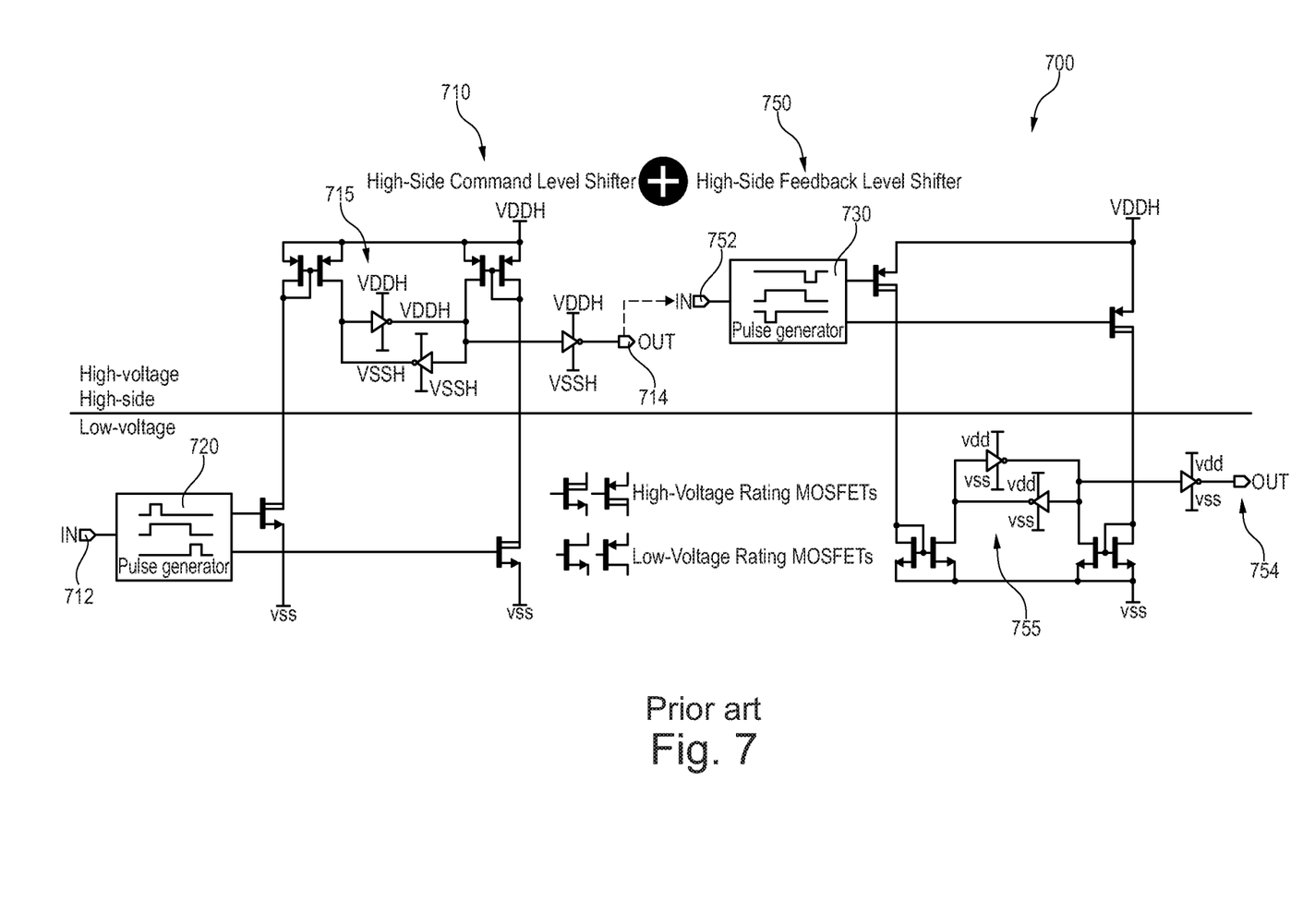
FIG. 7 illustrates a conventional level shifter circuit.

FIG. 7 shows a conventional example of a pulse-triggered level shifter pair 700. Shown is an example of a conventional pulse-triggered level shifter pair to control a high-side switch of a DC-DC converter. The level shifter pair 700 comprises a command level shifter circuit 710 and a feedback level shifter circuit 750. Each level shifter circuit 710, 750 comprises a set path (low to high signal transition) and a reset path (high to low signal transition). The command level shifter circuit 710 comprises a first pulse generator 720 in a low voltage domain, and a first latch circuit 715 in a high voltage domain. A command input signal 712 is received via the first pulse generator 720 and an output signal 714 may be used as a feedback input signal 752. The feedback level shifter circuit 750 comprises a second pulse generator 730 in a high voltage domain, and a second latch circuit 755 in a low voltage domain. A feedback output signal 754 can be used to build break-before-make operation of a synchronous low-side switch of said DC-DC converter (not shown). The duration of pulses (generated by the pulse generators 720, 730) is selected to guaranty (by design) state change of the latch circuits 715, 755 and of the output signals with respect to input signals.

However, pulse generators also cause drawbacks: if the pulse duration is selected too short, the output state might not change during the pulse duration or the state change remains undetected by feedback, which might cause incorrect operation of DC-DC converter or complete malfunction due to cross-conduction condition on its output. If the pulse duration is set too long, the power consumption is unnecessarily increased.

OBJECT AND SUMMARY

There may be a need to provide an accurate, energy-efficient, and robust (pulse-triggered) level shifter circuit, in particular for a DC-DC converter.

A level shifter circuit, a DC-DC converter, and a method of operation a level shifter circuit according to the independent claims are provided.

According to an aspect of the present disclosure, a pulse-triggered level shifter circuit is described. The level shifter circuit comprises: i) a command circuit configured to shift a command input signal of a first voltage domain to a command output signal of a second voltage domain (wherein the first voltage domain is different from the second voltage domain). The command circuit comprises: a) a command input stage for receiving the command input signal, and b) a command output stage for providing the command output signal. The level shifter circuit further comprises ii) a feedback circuit coupled to the command circuit (e.g. via at least one connection element) and configured to shift a feedback input signal of a third voltage domain to a feedback output signal of a forth voltage domain (wherein the third voltage domain is different from the forth voltage domain), the feedback circuit comprises: c) a feedback input stage for receiving the command output signal as the feedback input signal, and d) a feedback output stage for providing the feedback output signal. The command circuit and the feedback circuit are hereby integrated into one single level shifter circuit (in particular so that a temporally limited current pulse is set without an additional pulse generator circuit).

According to a further aspect of the present disclosure, a DC-DC converter (in particular a synchronous DC-DC converter) is described, which comprises at least one pulse-triggered level shifter circuit as discussed above.

According to a further aspect of the present disclosure, a method of operating a pulse-triggered level shifter circuit is described, wherein a command circuit and a feedback circuit are integrated into one single level shifter circuit, and wherein at least one connection element couples the command circuit and the feedback circuit. The method comprising: i) receiving a command input signal and providing a command output signal by the command circuit, ii) receiving the command output signal as the feedback input signal and providing a feedback output signal by the feedback circuit, and iii) setting, by the at least one connection element, at least one temporally limited current pulse without using an additional pulse generator circuit.

In the context of the present document, the term "pulse generator circuit" may in particular refer to an electronic circuit used to generate a pulse signal, e.g. a rectangular pulse. A pulse generator circuit is conventionally crucial for providing the pulses of a pulse-triggered level shifter circuit. Therefore, a dedicated pulse generator circuit is required for the pulse-triggered level shifter circuits of the prior art (e.g. U.S. Pat. No. 10,270,448 B1). The described pulse generator circuit of the prior art is a circuit which is presented in both, the command level shifter circuit and the feedback level shifter circuit. The duration of generated pulse should be selected to guaranty (by design) output signal change with respect to the input signal. When the duration is selected too short, the output signal might not change, causing incorrect operation or even damage of circuit using this prior art level shifter. If the pulse duration is set too long, the power consumption is unnecessarily increased.

In safety (human life) related applications, such as automotive, as example, and not necessarily related to power conversion, maloperation of level shifter might cause serious safety risk, which should be mitigated at any cost. Robust state change of shifted signal and feedback level shifter, allowing detection of command level shifter maloperation, are necessary countermeasures against potential incident.

According to an embodiment, the disclosure may be based on the idea that an accurate, energy efficient, and robust (pulse-triggered) level shifter circuit, in particular for a DC-DC converter, can be provided, when a command (level shifter) circuit and a feedback (level shifter) circuit are integrated into one single level shifter circuit. While conventionally a separate command level shifter circuit and a separate feedback level shifter circuit are applied (see e.g. FIG. 7 above), each having its own pulse generator with the above described disadvantages, in the presented disclosure two pulse-triggered level shifters may be combined and looped in one single (level shifter) circuit.

In an embodiment, the command circuit and the feedback circuit are coupled via one or more connection elements, so that temporally limited current pulses are set in the command circuit and in the feedback circuit without using an additional pulse generator circuit (see definition above). Said temporally limited (the duration of command and feedback current pulses may be limited, but kept enough to guaranty proper functionality, e.g. state change) current pulses may be self-aligned and last until a command signal propagates and feeds back through both, the command circuit and the feedback circuit, of the one integrated pulse triggered level shifter.

In the described level shifter circuit, the duration of the current pulses may be always long enough (without using additional pulse generators and a selection of pulse duration) to guaranty proper function (in particular a state change of memory elements, see below). As a consequence, the described level shifter circuit may be more reliable and robust in comparison with prior art level shifters, in which pulse duration has to be selected in design to guaranty proper function (in particular state change) regardless of process, voltage and temperature variations.

In an embodiment, two of the described level shifter circuits are combined in a break-before-make circuit of a synchronous DC-DC converter. Furthermore, even three pulse-triggered level shifter circuits may be integrated in the described manner in one single circuit, thereby providing at the same time break-before-make control and over-current protection, e.g. in a synchronous DC-DC converter.

According to an embodiment, the level shifter circuit is free of a (dedicated) pulse generator circuit. This may provide that drawbacks caused by pulse generators are efficiently overcome, while material costs and energy can be saved. Said drawbacks may include that, if the pulse duration is selected too short and the output state is not changed during pulse duration, the state change remains undetected, and the pulse is not prolongated or repeated. If the pulse duration is set too long, the power consumption is increased.

According to a further embodiment, the level shifter circuit comprises at least one connection element (e.g. an AND-gate), wherein the command circuit and the feedback circuit are coupled via the at least one connection element, so that at least one temporally limited current pulse (in particular a command current pulse) is set by the at least one connection element after the command input signal is received (e.g. as an input signal to the connection element), and wherein the at least one current pulse lasts until the command output signal and the feedback output signal have been provided. This may provide that accurate and reliable pulses (the duration is always enough) are set without the need of an additional pulse generator circuit. Thereby, the reliability is increased, while material and energy costs are decreased.

According to a further embodiment, the command circuit comprises i) a set command path for low to high signal transition, wherein the set command path is triggered by a first temporally limited current pulse set by a first connection element (of the at least one connection element). In particular, a corresponding set feedback path may be established that is triggered by a first feedback current pulse set by a first further connection element.

Additionally or alternatively, the command circuit comprises ii) a reset command path for high to low signal transition, wherein the reset command path is triggered by a second temporally limited current pulse set by a second connection element (of the at least one connection element). In particular, a corresponding reset feedback path may be established that is triggered by a second feedback current pulse set by a second further connection element.

This may provide that the level shifter circuit can be applied in a flexible manner that allows different transitions without interfering with each other.

According to a further embodiment, the command input stage and the feedback output stage are coupled to an input terminal of the connection element (in particular an AND-gate), wherein an input to the at least one connection element comprises the command input signal and the feedback output signal, and wherein an output of the connection element comprises a temporally limited (command) current pulse. In particular an output terminal of the at least one connection element is coupled to a set pulse element (in particular a MOSFET). This may provide that the connection element may be realized in a straightforward and practical manner.

According to a further embodiment, the level shifter circuit further comprises at least one further connection element (in particular a MOSFET), wherein the command output stage and the feedback input stage are coupled to the at least one further connection element, wherein an input to the at least one further connection element comprises the feedback input signal and the command output signal, and wherein an output of the at least one further connection element comprises a temporally limited (feedback) current pulse. This may provide that the further connection element may be realized in a straightforward and practical manner.

According to a further embodiment, the level shifter circuit comprises two voltage domains. Hereby, i) the at least one connection element is arranged in the first voltage domain, and/or ii) the at least one further connection element is arranged in the second voltage domain. In this manner, the connection element design may be directly implemented into existing level shifter designs.

According to a further embodiment, the command circuit comprises a first memory element (in particular a first latch circuit), arranged in the first voltage domain, wherein the first memory element is coupled to the command output stage, and wherein the first memory element is configured to perform a first state change. Additionally or alternatively, the feedback circuit comprises a second memory element (in particular a second latch circuit), arranged in the second voltage domain, wherein the second memory element is coupled to the command circuit, and wherein the second memory element is configured to perform a second state change. In the described manner, an established a reliable electronic element can be provided in order to implement a state change. In an embodiment, the memory element is a latch circuit, e.g. a R/S latch, that changes state upon a specific voltage level.

According to a further embodiment the at least one connection element is configured to set the temporally limited current pulse long enough, so that the first state change and/or the second state change is enabled (in particular guaranteed) before the feedback output signal is provided. This may provide that the described level shifter circuit functions accurately and reliably.

According to a further embodiment, the second memory element is split into a first transition memory element for low to high signal transition and a second transition memory element for high to low signal transition. The level shifter circuit further comprises a further memory element, in particular a further latch circuit, coupled to the feedback circuit output stage. In the described manner, malfunctions within the feedback circuit may be efficiently overcome.

According to a further embodiment, the level shifter circuit further comprises an over-current protection circuit coupled within the feedback circuit, so that the command circuit, the feedback circuit, and the over-current protection circuit are integrated into one single level shifter circuit. In the described manner, it may be possible to even integrate an over-current protection mechanism into the already integrated level shifter circuit. Accordingly, in comparison to prior art examples, only one single level shifter circuit is applied instead of three separate level-shifter circuits.

In many cases, low-side and high-side switches, e.g. of synchronous DC-DC converter or of any other high voltage supply actuator, comprise integrated current sensors and/or over-current protection. Therefore, an over-current protection feedback signal may be passed using an additional level shifter circuit to the low voltage (control logic) domain to execute the protection mechanism. An over-current protection is generally time-spaced with respect to a turn-on process of either the low-side switch or the high-side switch. Some blanking time-out is generally recommended between turn-on and start of over-current detection to bypass noise created by power stage switching event. Accordingly, upon over-current detection, the corresponding switch should be turned off.

According to an embodiment, the described level shifter circuit is applied in (the power stage of) a DC-DC converter. In the context of the present document, the term "DC (-to-) DC converter" may in particular denote an electronic circuit or electromechanical device that converts a source of direct current (DC) from one voltage level to another. Power levels may range from very low (small batteries) to very high (high-voltage power transmission). A synchronous DC-DC converter may comprise a high-side switch and a low-side switch and require synchronous operation of said switches.

According to a further embodiment, the DC-DC converter comprises: a controller, (and a power stage comprising) a high-side switch (in particular comprising a level shifter circuit as described above), a low-side switch (in particular comprising a level shifter circuit as described above). Further, the DC-DC converter comprises a break-before-make circuit coupled between the controller, the high-side switch and the low-side switch. This may provide that the DC-DC converter can be operated in a robust and save manner. The break-before-make mechanism protects power stage of the converter from cross conduction at minimum value of dead time, which, when long, causes efficiency reduction in high-power converters.

A synchronous DC-DC converter may comprise a high-side switch and a low-side switch and require synchronous operation of said switches. In particular, one switch may not be allowed for being switched-on until the other switch is switched off. The time gap between these two instants of i) switching-off and then ii) switching-on, is called dead time, which may be traded-off to avoid cross conduction at too short or negative dead times and to reduce dead time dependent losses such as forward conduction and reverse-recovery at too long dead time. While there are approaches to control, regulate or adapt dead time in the prior art, except their complexity, such sophisticated approaches might not be robust and appreciated for applications working in noisy electrical environment, such as automotive, for instance. In this case, more straightforward and robust implementation such as "break-before-make" may be applied.

In the context of the present document, the term "break-before-make" may refer to a circuit, which comprises at least two switches. When the first switch is turned off (break), the break-before-make circuit may ensure that the first and the second switch are both off. Then, the second switch only is turned on (make). This may prevent two voltage domains (e.g. a high-side switch and a low-side switch) from being short-circuited during the changeover between said two switches.

The high-side switch and the low-side switch may comprise an integrated pulse-triggered level shifter circuit as described above. However, it is also possible that only the high-side switch or only the low-side switch comprises said level shifter circuit.

According to a further embodiment of the DC-DC converter, i) the high-side switch comprises a high-side command circuit and a high-side feedback circuit, ii) the low-side switch comprises a low-side command circuit and a low-side feedback circuit, iii) a high-side output (in particular the state of a high-side gate driver) of the high-side feedback circuit is used as a low-side input for the low-side command circuit (via the break-before-make circuit), and iv) a low-side output (in particular the state of a low-side gate driver) of the low-side feedback circuit is used as a high-side input for the high-side command circuit (via the breakbefore-make circuit). This may provide that the DC-DC converter can be operated especially robust and save.

The aspects defined above and further aspects of the disclosure are apparent from the examples of embodiment to be described hereinafter and are explained with reference to these examples of embodiment. The disclosure will be described in more detail hereinafter with reference to examples of embodiment but to which the disclosure is not limited.

BRIEF DESCRIPTION OF THE DRAWINGS

The illustrations in the drawings are schematic. In different drawings, similar or identical elements are provided with the same reference signs.

DESCRIPTION OF EMBODIMENTS

Before, referring to the drawings, embodiments will be described in further detail, some basic considerations will be summarized based on which embodiments of the disclosure have been developed.

According to an embodiment, two different pulse-triggered level shifters are arranged into one single circuit, in which the duration of command current pulses and feedback current pulses is always enough (without dedicated pulse generators and selection of pulse duration) to guaranty state change (e.g. of respective latch circuits). In this manner, the described level shifter design is more reliable and robust in comparison with two independent pulse-triggered level shifters of the prior art, in which pulse duration has to be selected in design to guaranty proper state change regardless of process, voltage and temperature variations. In an embodiment, the integrated level shifter circuit is further enhanced to pass, without noticeable circuitry overhead, an additional over-current feedback signal, for which conventionally a third level shifter circuit would have been necessary.

According to an embodiment, it is a basic idea to combine a command level shifter circuit with a further feedback level shifter circuit into one pulse-triggered level shifter circuit so that pulse duration is bounded by signal propagation between the first and the second level shifter (i.e. command circuit and feedback circuit). Hence, the described new level shifter circuit does not require dedicated pulse generators and selection of pulse duration. Any malfunction in signal propagation and return could be easily detected in safety related applications. Moreover, the feedback circuit could be further re-used for yet another feedback signal propagation, such as over-current protection, thus excluding any need for a third level shifter.

Figure 1:
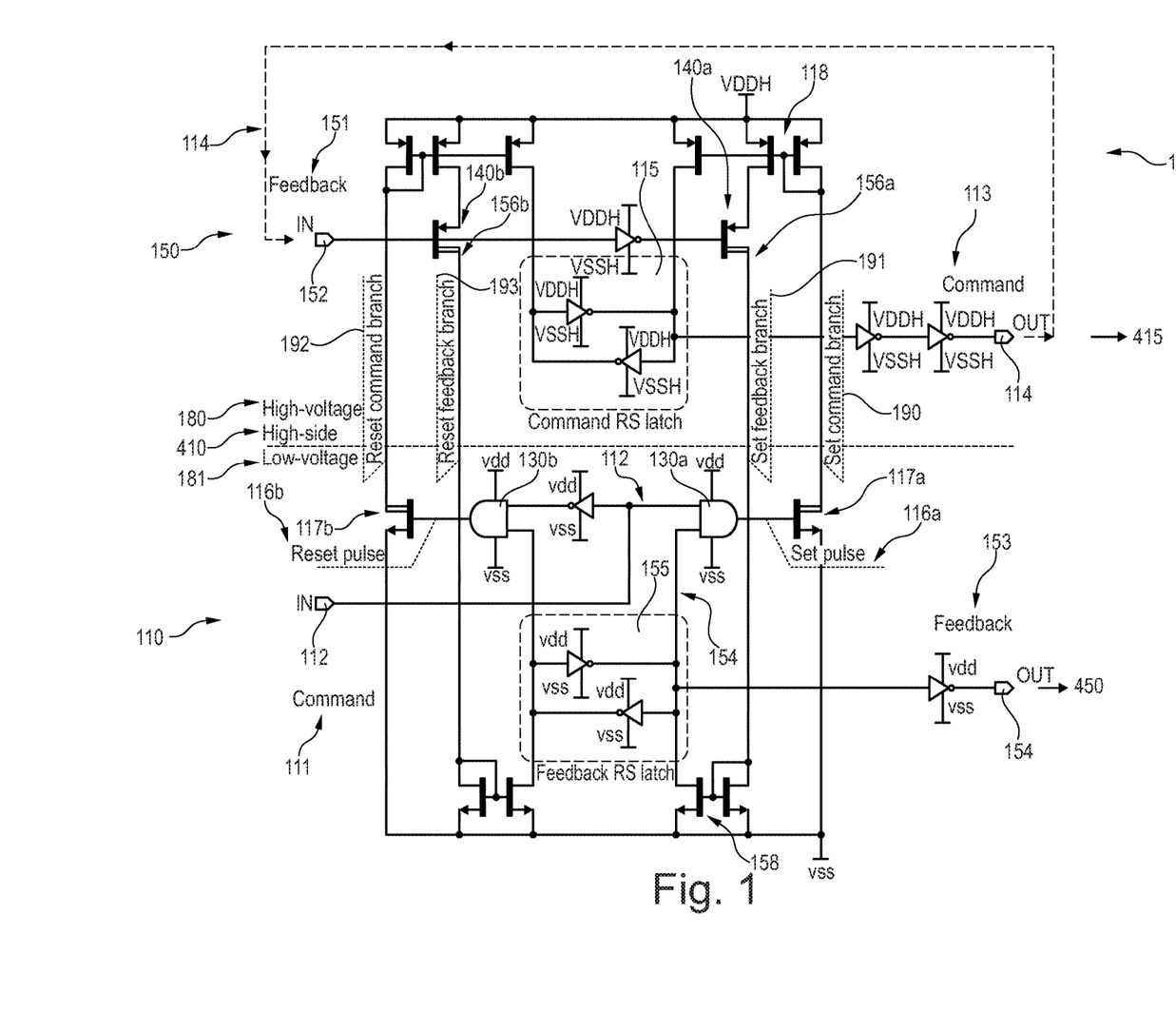
FIG. 1 illustrates a level shifter circuit according to an embodiment of the disclosure.

FIG. 1 shows a pulse-triggered level shifter circuit 100 according to an embodiment. In contrast to the conventional example shown in FIG. 7 (see above), there is no pair of two separate level shifter circuits. Instead, there is only one single integrated pulse-triggered level shifter circuit 100 which comprises a command circuit 110 and a feedback circuit 150. Furthermore, the pulse-triggered level shifter circuit 100 shown is free of a (dedicated) pulse generator.

The command circuit 110 comprises a set command path (low to high signal transition) 190 and a reset command path (high to low signal transition) 192. The feedback circuit 150 in turn comprises a set feedback path 191 (corresponding to the set command path 190) and a reset feedback path 193 (corresponding to the reset command path 192). In the following, for the sake of clarity, the set command path 190 and the set feedback path 191 only are discussed in detail. The same description holds, however, true also for the reset command path 192 and the reset feedback path 193. In the example shown, a pulse-triggered level shifter circuit 100 of a high-side switch 410 of a synchronous DC-DC converter 400 (see FIG. 4) is shown.

The command circuit 110 comprises a command input stage 111 and connection elements 130a, 130b in a low voltage domain 180, as well as a command output stage 113 and a first memory element 115 in a high voltage domain 181. A command input signal 112 is received by command input stage 111 and is forwarded to a first connection element 130a in the set command path 190 or to a second connection element 130b in the reset command path 192. In the example shown, the connection elements 130a, 130b are realized as AND-gates which receive the command input signal 112 and a feedback output signal 154 (see discussion below) as an input. The first connection element 130a controls (sets a first temporally limited (command) current pulse 116a) the set command path 190, while the second connection element 130b controls (sets a second temporally limited (command) current pulse) the reset command path 192. Hereby, the state of the first memory element 115 is controlled (changed). In the example shown, the first memory element 115 is realized as an R/S latch circuit and the set command path 190 comprises a set pulse element (MOSFET) 117 that is connected via a first current mirror 118 to the first memory element 115. The set command path 190 is further coupled (in the example via the current mirror 118) to a further connection element 140a. The further connection element 140a is implemented as a MOSFET that is coupled to a feedback input stage 151 and a set feedback path 191 (see discussion below). The state of the first memory element 115 controls the command output stage 113 that provides the command output signal 114. Hereby, the voltage domain of the command output signal 114 is shifted with respect to the voltage domain of the command input signal 112.

The feedback circuit 150 comprises the feedback input stage 151 and the further connection elements 140a, 140b in the high voltage domain 181, and the feedback output stage 153 and a second memory element 155 in the low voltage domain 180. The command output signal 114 is received by the feedback input stage 151 as a feedback input signal 152 and is forwarded to the first further connection element 140a in the set feedback path 191 or to the second further connection element 140b in the reset feedback path 193. As described above, the further connection elements 140a, 140b are implemented as MOSFETs, wherein the source is connected to the set command path 190 (in particular the current mirror 118), the drain is connected to the set feedback path 191, and the gate is controlled by the feedback input signal 151. The first further connection element 140a controls (sets a first feedback current pulse) the set feedback path 191, and the second further connection element 140b controls (sets a second feedback current pulse) the reset feedback path 193. Hereby, the state of the second memory element 155 is controlled (changed). In the example shown, the second memory element 155 is realized as an R/S latch circuit and the set feedback command path 191 is connected via a second current mirror 158 to the second memory element 155. The set feedback path 191 is further coupled to the first connection element 130a. The second memory element 155 is further connected to the feedback output stage 153 which provides a feedback output signal 154. Hereby, the voltage domain of the feedback output signal 154 is shifted with respect to the voltage domain of the feedback input signal 152. The feedback output signal 154 can be used as an input for a low-side switch 420 via a break-before-make circuit 450 (see FIG. 4).

The command circuit 110 serves as an initiator of switching. In case of low to high signal transition, the command chain sets the first command current pulse 116a in the set command path 190. This current pulse 116a triggers a state change of the first memory element 115 located in the high voltage domain 181. Then, the command output signal 114 is i) received by a high-side switch 415 (see FIG. 4) and ii) returns back as feedback input signal 152. The feedback input signal 152 confirms the state change by setting the first feedback current pulse 156a through the set feedback path 191. In other words, the feedback current pulse 156a triggers state change of the second memory element 155 located in the low-voltage domain 180. The corresponding feedback output signal 154 can be forwarded to a break-before-make circuit 450 (see FIG. 4). A state change of the second memory element 155 discontinues both current pulses 116, 156 in set command path 190 and set feedback path 191.

In a similar manner, the described level shifter circuit 100 operates at high to low signal transition by setting the second command current pulse 116b in the reset command path 192 and the second feedback current pulse 156b in the reset feedback path 193.

Figure 2:
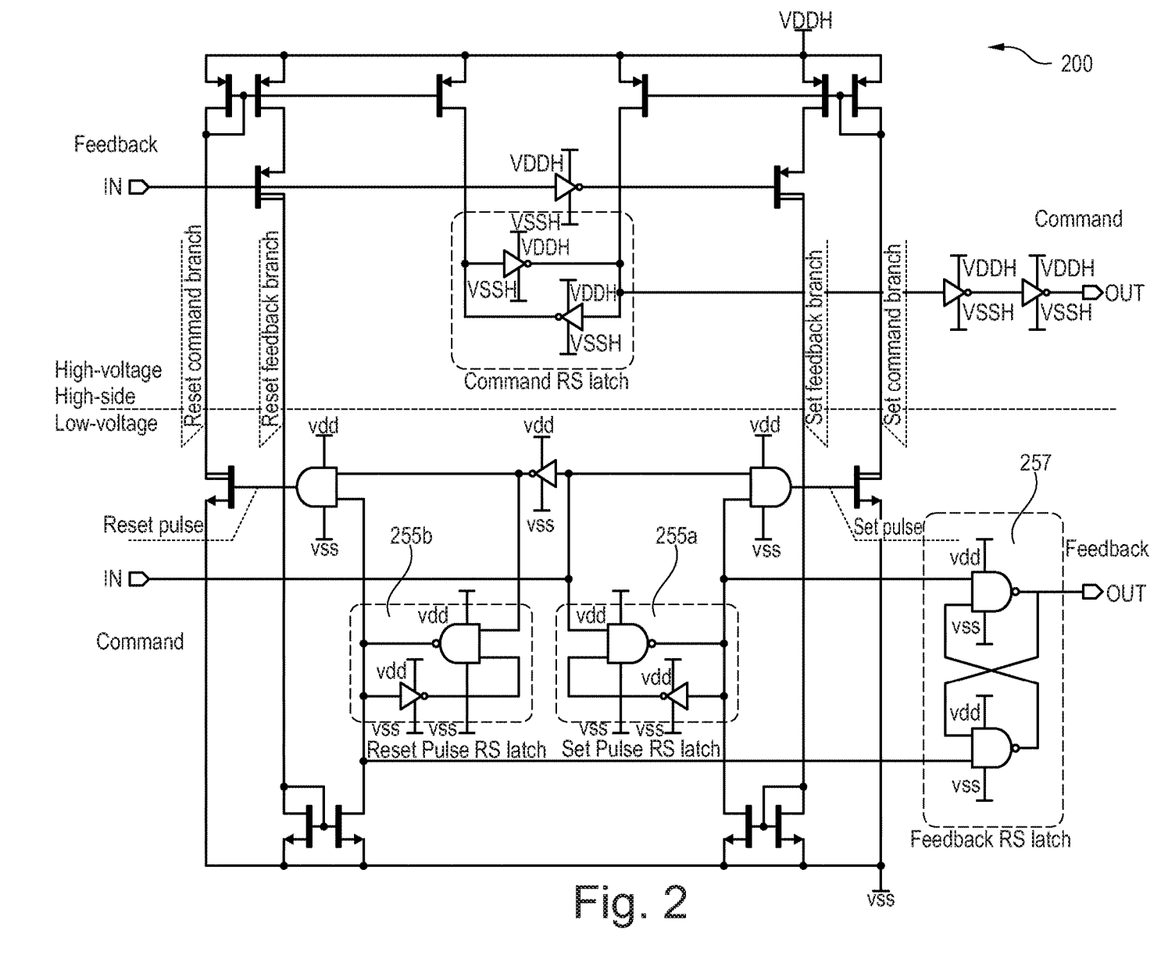
FIG. 2 illustrates a level shifter circuit according to a further embodiment of the disclosure.

FIG. 2 illustrates a further pulse-triggered level shifter circuit 200 according to a further embodiment. With respect to the design shown in FIG. 1, a severe failure in the feedback signal return path may lock the level shifter circuit 100. For instance, the circuit 100 could remain in a state that corresponds to on-state of a high-side switch, while the feedback reports its state corresponding to off-state of said high-side switch, which may cause e.g. cross conduction collision. Such condition can be prevented by the circuit modification shown in FIG. 2.

Hereby, the second memory element 155 is split into a modified first transition memory element 255a for low to high signal transition and a modified second transition memory element 255b for high to low signal transition. The level shifter circuit 200 further comprises a further memory element (realized as a RS-latch circuit with NAND gates) 257 coupled to the feedback output stage 153 for feedback output signal 154 formation. In presence of the feedback signal, any malfunction in signal propagation could be easily detected in control logic by comparing command and feedback signals in safety related applications. It should be also noticed, that is common for pulse-triggered level shifters, that their command and feedback (RS) latch(es) should be set in proper state by reset circuitry. Even, if by some reason states in low voltage domain and high voltage domain mismatch, their proper correspondence will be auto-recovered after at least a complete cycle of state changing.

Figure 3:
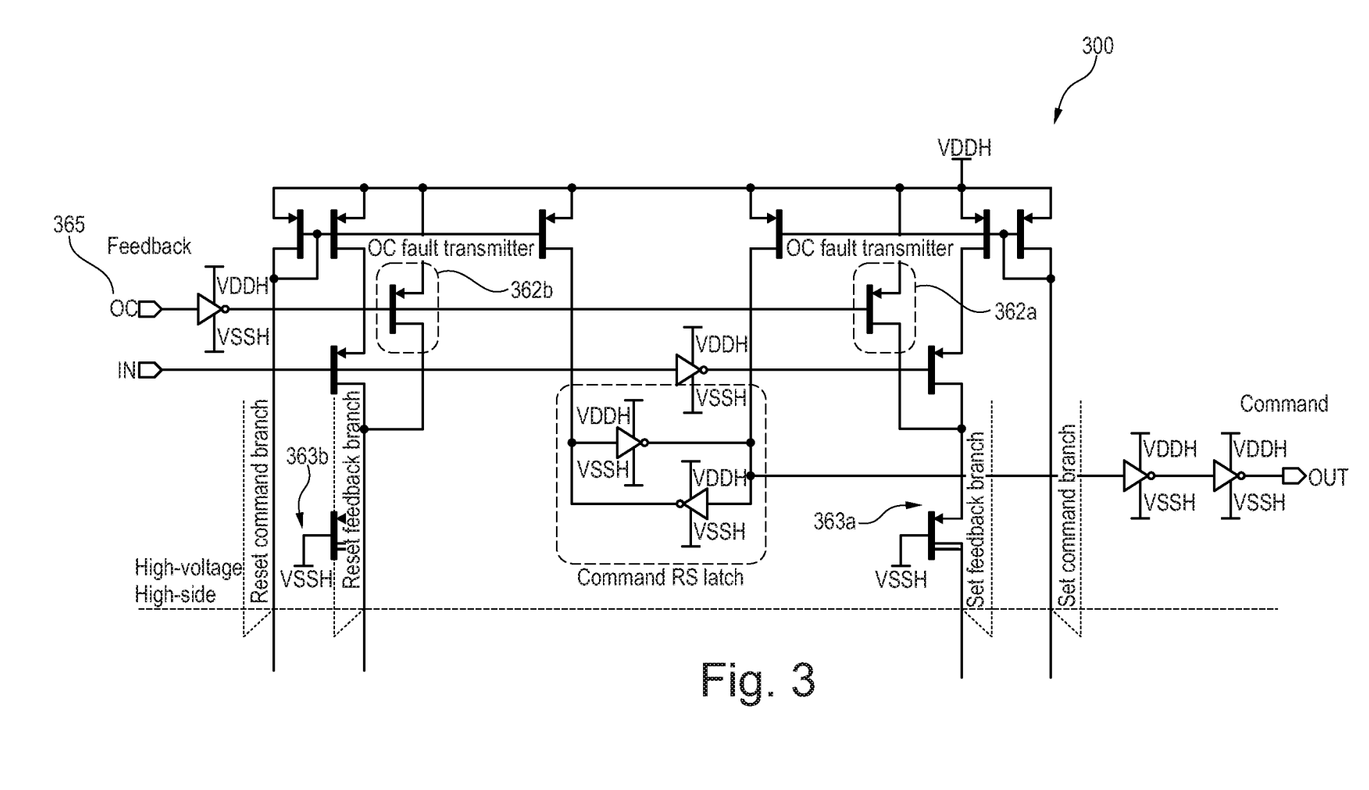
FIG. 3 illustrates a level shifter circuit with integrated over-current protection according to an embodiment of the disclosure.

FIG. 3 illustrates a further pulse-triggered level shifter circuit 300 according to another embodiment. In this example, an over-current protection circuit is coupled within the feedback circuit 150, so that the command circuit 110, the feedback circuit 150, and the over-current protection circuit are integrated into one single level shifter circuit 300. The described integrated level shifter circuit 300 is enabled to pass over-current fault feedback to control logic, while the conventional need to provide a third level shifter circuit is excluded.

An over-current fault feedback signal is passed by initiating over-current pulses (see over-current input stage 365, over-current pulse elements 362a,b, and over-current and feedback connection elements 363a,b) in the set feedback path 191 and the reset feedback path 193. Generally, over-current pulse elements 362a,b should be large (big size) high-voltage switches, in particular the same as the further connection elements 140a,b of level-shifter circuit 100. In this embodiment, over-current and feedback connection elements 363a,b require only two instead of four high-voltage switches, "cascades" (isolates from high-voltage) low-voltage pulse elements 362a,b and low-voltage further connection elements of feedback paths. The over-current fault feedback signals are then detected with a corresponding (low voltage domain) over-current fault receiver circuitry 360 and reported as an over-current fault signal via an over-current output stage 364 to logic circuitry. In order to avoid interferences with the feedback and its memory element 155 (255a,b), the over-current signal is gated by MOSFETs (see over-current gates 361a, b). In the example shown (which is based on FIG. 2), the first transition memory element 255a ("set pulse RS latch") is gated by switch for events other than a set pulse generation. The second transition memory element 255b ("reset pulse RS latch") is gated by switch for over-current fault events.

As a consequence, an over-current fault leads logic to turn-off the switch, which caused the over-current fault, and initiates a turn-off signal propagation through the reset command path 192. When an over-current fault is released in the high voltage domain 181 immediately by turn-off command, current pulses in reset command path 192 and reset feedback path 193 discontinue, and over-current fault is released in the receiver circuitry 360 which unlocks, via gates 361a,b, the transition memory elements 255a/b. So feedback signal 151, which comes with delay in respect to release of the over-current signal due to signal propagation in gate driver, initiates a regular, in terms of circuit 100 and 200, turn-off process utilizing currents in reset command path 192 and set feedback path 191.

Figure 4:
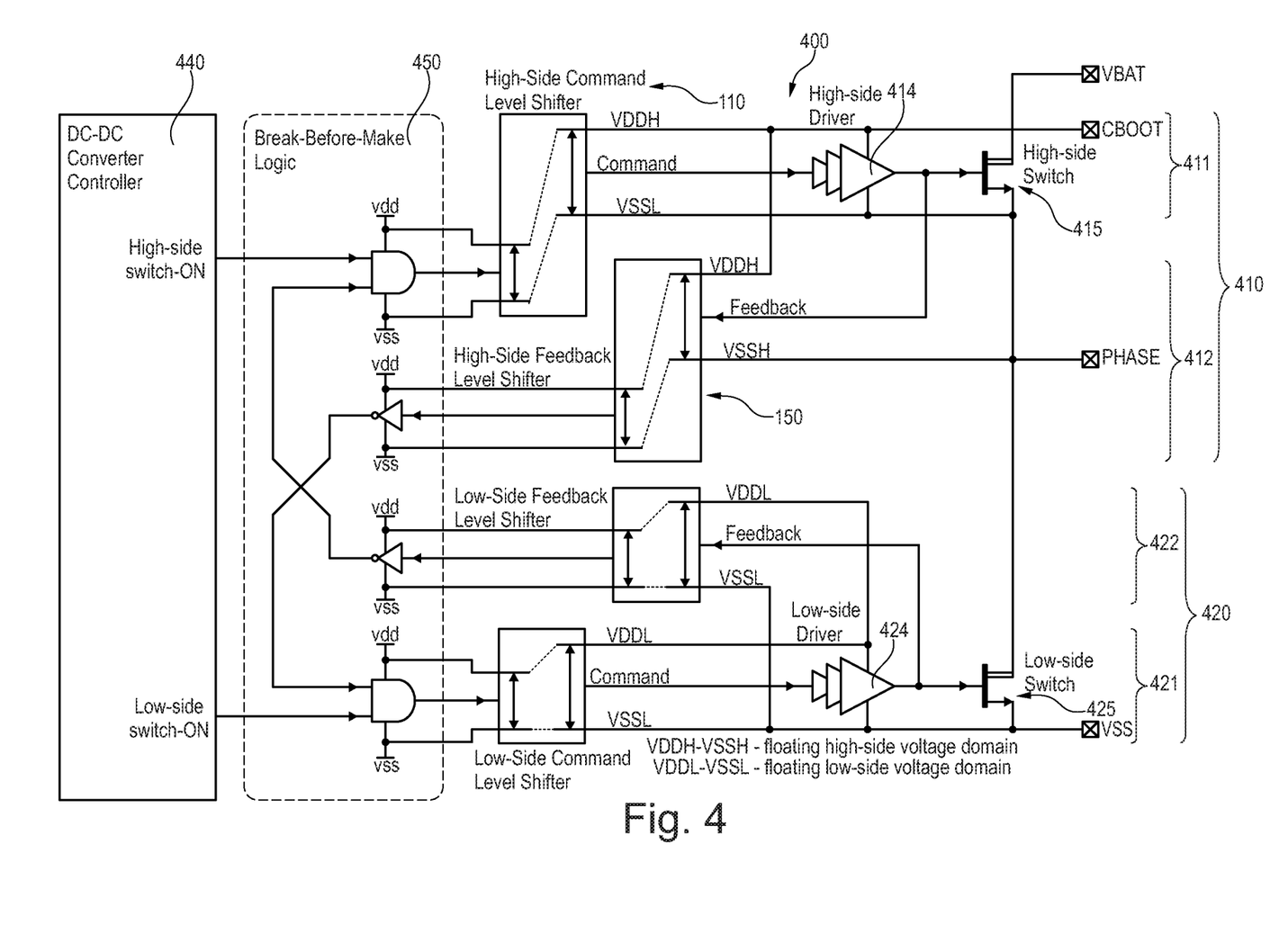
FIG. 4 illustrates a DC-DC converter with a level shifter circuit according to an embodiment of the disclosure.

FIG. 4 illustrates a DC-DC converter 400 with a level shifter circuit 100 as described above according to an embodiment. Shown is the power stage (output filter is not shown) of a synchronized step-down DC-DC converter 400, having a bootstrapped high-side n-channel power MOSFET switch. The DC-DC converter 400 comprises: a controller 440, a high-side switch 410 (in particular comprising a level shifter circuit 100 as described above), a low-side switch 420 (in particular comprising a level shifter circuit 100 as described above). Further, the DC-DC converter 400 comprises a break-before-make circuit 450 coupled between the controller 440, the high-side switch 410, and the low-side switch 420. The break-before-make mechanism excludes risk of cross conduction condition, when high-side switch 410 might be turned-on before low-side switch 420 is turned-off and vice versa. A high-side output of the high-side feedback circuit 412 is used as a low-side input for the low-side command circuit 421 via the break-before-make circuit 450. Further, a low-side output of the low-side feedback circuit is used as a high-side input for the high-side command circuit via the break-before-make circuit. The high-side switch 410 comprises a high-side gate drive 414 coupled to a high-side switch 415, and the low-side switch 420 comprises a low-side gate driver 424 coupled to a low-side switch 425.

Figure 5:
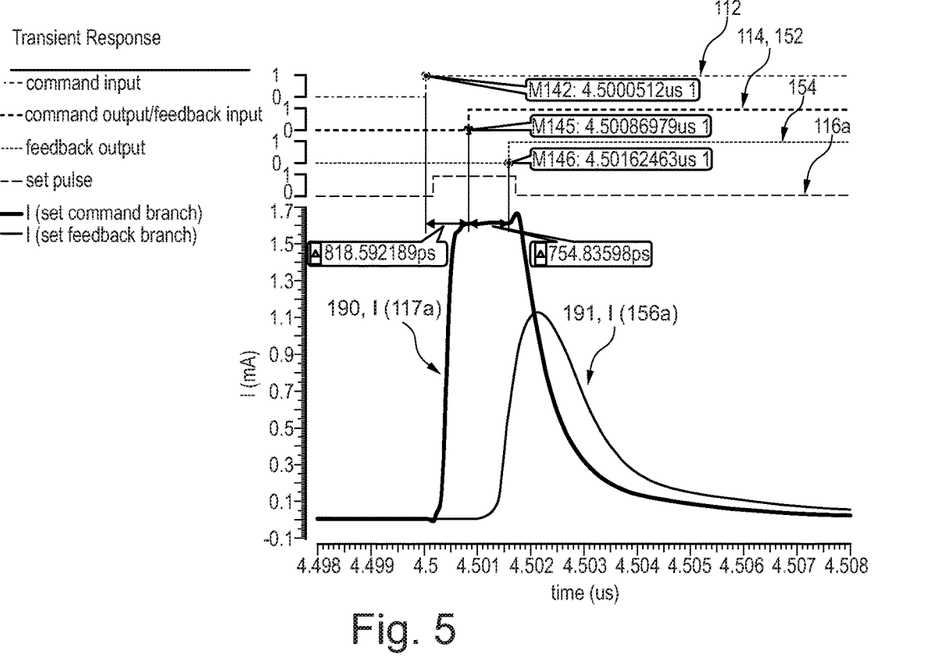
FIG. 5 illustrates a simulation of a level shifter circuit according to FIG. 2 in the power stage of a DC-DC converter.

FIG. 5 illustrates a simulation of a level shifter circuit 200 according to FIG. 2 in the power stage of a DC-DC converter 400. The level shifter circuit 200 was designed to translate a first swing input command signal into a second swing output across a voltage difference. Shown is low-to-high state propagation waveforms of key signals, such as command input signal 112, command output signal 114/feedback input signal 152, feedback output signal 154, set pulse 116a, and currents in set command path 190 and set feedback path 191. The designed circuit (w/o fine optimization) shows 808 pS/1.16 nS propagation delays of the command signal, from which 300 pS/200 pS are delays of command signal propagation through command output's buffer.

Figure 6:
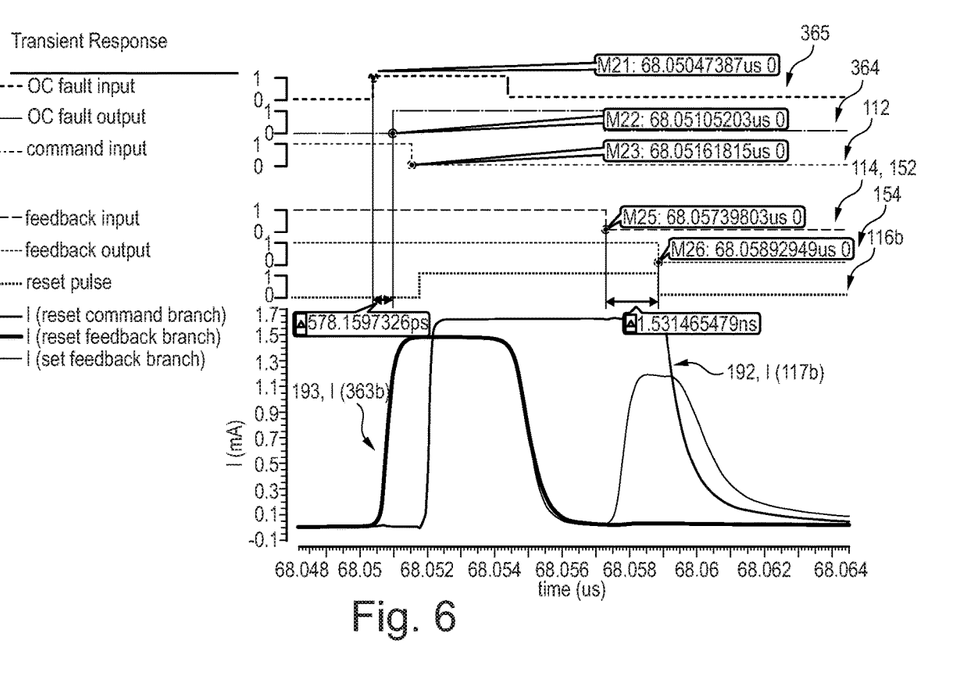
FIG. 6 illustrates a simulation of a level shifter circuit according to FIG. 3 in the power stage of a DC-DC converter.

FIG. 6 illustrates a simulation of a level shifter circuit 300 according to FIG. 3 in the power stage of a DC-DC converter 400. The level shifter circuit 300 has been simulated in condition of severe short circuit of power stage's output to ground. Shown is over-current signal and corresponding high-to-low state propagation waveforms of key signals at over-current fault protection, such as over-current fault signal on the over-current input 365 and on the over-current output 364, command input signal 112, command output signal 114/feedback input signal 152, feedback output signal 154, set pulse 116b, and currents in reset command path 192 and reset feedback path 192.

In this specification, embodiments have been presented in terms of a selected set of details. However, a person of ordinary skill in the art would understand that many other embodiments may be practiced which include a different selected set of these details. It is intended that the following claims cover all possible embodiments.

REFERENCE NUMERALS 100, 200, 300 Level shifter circuit
110 Command circuit
111 Command input stage
112 Command input signal
113 Command output stage
114 Command output signal
115 First memory element, latch circuit
116 Command current pulse
116a,b First/second command current pulse
117 Set pulse element
118 First current mirror
130 Connection element, AND gate
130a,b First/second connection element
140 Further connection element, MOSFET
140a,b First/second further connection element
150 Feedback circuit
152 Feedback input signal
153 Feedback output stage
154 Feedback output signal
155 Second memory element, latch circuit
156 Feedback current pulse
156a,b First/second feedback pulse
158 Second current mirror
180 Low/first voltage domain
181 High/second voltage domain
190 Set command path
191 Set feedback path
192 Reset command path
193 Reset feedback path
255a,b First/second transition element
257 Further memory element
360 Over-current receiver
361a,b First/second over-current gate
362a,b First/second over-current pulse element
363a,b First/second feedback and over-current connection element
364 Over-current output stage
365 Over-current input stage
400 DC-DC converter
410 High-side switch
411 High-side command circuit
412 High-side feedback circuit
414 High-side gate driver
415 High-side switch
420 Low-side switch
421 Low-side command circuit
422 Low-side feedback circuit
424 Low-side gate driver
425 Low-side switch
440 Controller
450 Break-before-make circuit
700 Prior art level shifter pair
710 Prior art command level shifter circuit
712 Prior art command input signal
714 Prior art command output signal
715 Prior art first latch circuit
720, 730 Prior art pulse generators
750 Prior art feedback level shifter circuit
752 Prior art feedback input signal
754 Prior art feedback output signal
755 Prior art second latch circuit

The invention claimed is:

1. A pulse-triggered level shifter circuit comprising:
a command circuit configured to shift a command input signal of a first voltage domain to a command output signal of a second voltage domain, wherein the command circuit comprises:
a command input stage for receiving the command input signal,
a command output stage for providing the command output signal;
a feedback circuit, coupled to the command circuit, and configured to shift a feedback input signal of a third voltage domain to a feedback output signal of a forth voltage domain, wherein the feedback circuit comprises:
a feedback input stage for receiving the command output signal as the feedback input signal, and
a feedback output stage for providing the feedback output signal;
wherein the command circuit and the feedback circuit are integrated into one single level shifter circuit;
at least one connection element, wherein:
the command circuit and the feedback circuit are coupled via the at least one connection element, so that at least one temporally limited current pulse is set by the at least one connection element after the command input signal is received;
the command input stage and the feedback output stage are coupled to an input terminal of the at least one connection element;

an input to the at least one connection element comprises the command input signal and the feedback output signal;

an output of the at least one connection element is a temporally limited command current pulse; and wherein the at least one current pulse lasts until the command output signal and the feedback output signal have been provided.

2. The level shifter circuit according to claim 1, comprising at least one of the following features:

wherein the command circuit comprises a first memory element arranged in the second voltage domain, wherein the first memory element is coupled to the command output stage, and wherein the first memory element is configured to perform a first state change;

wherein the feedback circuit comprises a second memory element arranged in the first voltage domain, wherein the second memory element is coupled to the command circuit, and wherein the second memory element is configured to perform a second state change.

3. The level shifter circuit according to claim 2, wherein the at least one connection element is configured to set the temporally limited current pulse long enough, so that at least one of the first state change and the second state change is enabled before the feedback output signal is provided.

4. The level shifter circuit according to claim 2, wherein the second memory element is split into a first transition memory element for low to high signal transition and a second transition memory element for high to low signal transition, and wherein the level shifter circuit further comprises:

a further memory element coupled to the feedback output stage.

5. A DC-DC converter comprising a level shifter circuit according to claim 1.

6. The DC-DC converter according to claim 5, wherein the DC-DC converter is a synchronous DC-DC converter.

7. The DC-DC converter according to claim 5, further comprising:

a controller, a high-side switch, a low-side switch, and a break-before-make circuit coupled between the controller, the high-side switch, and the low-side switch.

8. The DC-DC converter according to claim 5, wherein the high-side switch comprises a high-side command circuit and a high-side feedback circuit, wherein the low-side switch comprises a low-side command circuit and a low-side feedback circuit, wherein a high-side output of the high-side feedback circuit is used as a low-side input for the low-side command circuit via the break-before-make circuit, and wherein a low-side output of the low-side feedback circuit is used as a high-side input for the high-side command circuit via the break-before-make circuit.

9. The level shifter circuit according to claim 1, wherein the level shifter circuit further comprises:

at least one further connection element, wherein the command output stage and the feedback input stage are coupled to the at least one further connection element, wherein an input to the at least one further connection element comprises the feedback input signal and the command output signal, and wherein an output of the at least one further connection element is a temporally limited feedback current pulse.

10. The level shifter circuit according to claim 9, wherein the at least one further connection element is a MOSFET.

11. The level shifter circuit according to claim 1, wherein the level shifter circuit is free of a pulse generator circuit.

12. The level shifter circuit according to claim 1, wherein the command circuit comprises a set command path for low to high signal transition, and wherein the set command path is triggered by a first temporally limited current pulse set by a first connection element.

13. The level shifter circuit according to claim 1, wherein the command circuit comprises a reset command path for high to low signal transition, and wherein the reset command path is triggered by a second temporally limited current pulse set by a second connection element.

14. The level shifter circuit according to claim 1, wherein an output terminal of the at least one connection element is coupled to a MOSFET set pulse element.

15. The level shifter circuit according to claim 1, wherein the at least one connection element is an AND-gate.

16. The level shifter circuit according to claim 1, wherein the level shifter circuit comprises a first voltage domain and a second voltage domain;

wherein the at least one connection element is arranged in the first voltage domain, and/or wherein the at least one further connection element is arranged in the second voltage domain.

17. The level shifter circuit according to claim 1, further comprising:

an over-current protection circuit coupled within the feedback circuit, so that the command circuit, the feedback circuit, and the over-current protection circuit are integrated into one single level shifter circuit.

* * * * *